US010763376B1

(12) United States Patent
Frost et al.

(10) Patent No.: US 10,763,376 B1
(45) Date of Patent: Sep. 1, 2020

(54) METHOD FOR FORMING AN ELECTRICAL INTERCONNECT

(71) Applicants: John S. Frost, Oak Park, CA (US); Randolph J. Brandt, Palmdale, CA (US); Peter Hebert, Glendale, CA (US); Omar Al Taher, Los Angeles, CA (US)

(72) Inventors: John S. Frost, Oak Park, CA (US); Randolph J. Brandt, Palmdale, CA (US); Peter Hebert, Glendale, CA (US); Omar Al Taher, Los Angeles, CA (US)

(73) Assignee: THE BOEING COMPANY, Chicago, IL (US)

( * ) Notice: Subject to any disclaimer, the term of this patent is extended or adjusted under 35 U.S.C. 154(b) by 694 days.

(21) Appl. No.: 14/843,181

(22) Filed: Sep. 2, 2015

Related U.S. Application Data

(62) Division of application No. 13/025,013, filed on Feb. 10, 2011, now Pat. No. 9,153,720.

(51) Int. Cl.
*H01L 31/02* (2006.01)
*H05K 1/02* (2006.01)
(Continued)

(52) U.S. Cl.
CPC ....... *H01L 31/02008* (2013.01); *H01R 43/02* (2013.01)

(58) Field of Classification Search
CPC ......... H01L 24/28; H01L 24/29; H01L 24/45; H01L 24/48; H01L 24/66; H01L 31/0508;
(Continued)

(56) References Cited

U.S. PATENT DOCUMENTS 3,096,571 A * 7/1963 Koch .................. B23Q 35/104
29/897.15
3,205,563 A * 9/1965 Pauls ...................... F28F 1/22
29/890.042
(Continued)

FOREIGN PATENT DOCUMENTS

| WO | 2008094048 A2 | 8/2008 |
| WO | 2009049572 A1 | 4/2009 |
| WO | 2009066583 A1 | 5/2009 |

OTHER PUBLICATIONS

"CDO-100-IC Concentrator Photovoltaic Cell with Welded Leads (ICs)," Spectrolab Photovoltaic Products, Spectrolab Inc., Sylmar, California, dated Apr. 24, 2007, 2 pages.
(Continued)

*Primary Examiner* — Peter Dungba Vo
*Assistant Examiner* — Kaying Kue
(74) *Attorney, Agent, or Firm* — Moor IP Law

(57) ABSTRACT

A method including forming an interconnect in a metal member. The interconnect includes multiple repeating, nested V-shaped structures forming a continuous central portion. A vertex of each of the multiple repeating, nested V-shaped structures adjoins a next vertex of a next V-shaped structure of the multiple repeating, nested V-shaped structures. The method further includes separating the interconnect from the metal member.

20 Claims, 5 Drawing Sheets

(51) Int. Cl.
*H05K 3/40* (2006.01)
*H01R 43/02* (2006.01)

(58) Field of Classification Search
CPC . H01L 31/0504; H01L 31/05; H01L 31/0512; H01L 31/0516; H01L 31/02008; Y10T 29/49204; Y10T 29/49355; Y02E 10/50; H05K 2201/10143; H01R 43/02
USPC .......... 29/874, 825, 829, 846, 847; 136/136, 136/256, 252, 244
See application file for complete search history.

(56) References Cited

U.S. PATENT DOCUMENTS

| | | | |
|---|---|---|---|
| 3,466,198 A * | 9/1969 | Yasui | H01L 31/0508 136/244 |
| 3,819,417 A | 6/1974 | Haynos | |
| 3,849,880 A | 11/1974 | Haynos | |
| 4,193,820 A | 3/1980 | Thomas | |
| 4,209,347 A | 6/1980 | Klein | |
| 4,224,592 A * | 9/1980 | Urani | H01H 69/02 337/198 |
| 4,361,717 A | 11/1982 | Gilmore et al. | |
| 4,370,509 A | 1/1983 | Dahlberg | |
| 4,434,548 A * | 3/1984 | Beswick | H01H 69/02 228/180.1 |
| 4,652,693 A | 3/1987 | Bar-On | |
| 5,006,179 A | 4/1991 | Gaddy | |
| 5,100,808 A | 3/1992 | Glenn | |
| 5,167,724 A | 12/1992 | Chiang | |
| 5,185,042 A | 2/1993 | Ferguson | |
| 5,235,743 A * | 8/1993 | Endo | H01R 13/03 29/874 |
| 5,498,297 A * | 3/1996 | O'Neill | H01L 31/052 136/246 |
| 5,580,466 A * | 12/1996 | Tada | B23K 26/067 29/827 |
| 5,661,448 A * | 8/1997 | Totsuka | H01H 85/044 29/623 |
| 6,147,586 A * | 11/2000 | Saitoh | H01H 69/02 29/623 |
| 6,150,602 A | 11/2000 | Campbell | |
| 6,313,396 B1 | 11/2001 | Glenn | |
| 6,315,575 B1 * | 11/2001 | Kajimoto | H01L 31/188 136/256 |
| 6,359,209 B1 * | 3/2002 | Glenn | H01L 31/0508 136/244 |
| 6,439,975 B1 | 8/2002 | Shih et al. | |
| 6,743,982 B2 * | 6/2004 | Biegelsen | B25J 13/084 174/69 |
| 7,390,961 B2 * | 6/2008 | Aschenbrenner | H01L 31/0508 136/244 |
| 7,419,377 B1 * | 9/2008 | Briere | H01L 31/0508 439/32 |
| 7,808,362 B2 * | 10/2010 | Stanek | H01H 85/0013 337/186 |
| 8,587,333 B2 * | 11/2013 | Sato | G01R 1/06716 324/500 |
| 9,029,689 B2 * | 5/2015 | Phu | H01L 31/0508 136/256 |
| 9,153,720 B1 * | 10/2015 | Frost | H01L 31/0508 |
| 2001/0030043 A1 * | 10/2001 | Gleisle | F28F 3/10 165/167 |
| 2002/0059952 A1 | 5/2002 | Shimada | |
| 2003/0047206 A1 | 3/2003 | Kawam | |
| 2004/0094195 A1 | 5/2004 | Kuechler | |
| 2008/0244878 A1 * | 10/2008 | Hoehe | A44B 18/0015 24/445 |
| 2009/0139557 A1 * | 6/2009 | Rose | H01L 31/0516 136/244 |
| 2009/0318037 A1 | 12/2009 | Wirth | |
| 2010/0108123 A1 | 5/2010 | Asberg et al. | |
| 2010/0144218 A1 | 6/2010 | Rose et al. | |
| 2010/0243028 A1 | 9/2010 | Sainoo et al. | |
| 2011/0252657 A1 * | 10/2011 | Sato | G01R 1/06716 33/561 |
| 2012/0179238 A1 * | 7/2012 | Sarac | A61F 2/915 623/1.16 |

OTHER PUBLICATIONS

"Definition of Gap," retrieved on Jul. 26, 2013, http://merriam-webster.com/dictionary/gap, 1 page.
"Definition of Stamp," retrieved on Jul. 29, 2013, http://merriam-webster.com/dictionary/stamping, 1 page.
"Silicon Material Properties: 5.4 Thermal Expansion," Handbook of Semiconductor Silicon Technology, ed. W.C. O'Mara et al., 1990, Noyes Publications, Park Ridge, NJ, p. 431.
Bailey, A.C. et al., "The Thermal Expansion of Palladium-Silver Alloys at Low Temperatures," Journal of Physics C. (Solid State Physics), Series 2, vol. 2, Great Britain, 1969, pp. 769-776.

* cited by examiner

METHOD FOR FORMING AN ELECTRICAL INTERCONNECT

PRIORITY CLAIM

This application claims priority from, and is a divisional of U.S. patent application Ser. No. 13/025,013, filed on Feb. 10, 2011, which is incorporated herein by reference in its entirety.

STATEMENT OF GOVERNMENT RIGHTS

This invention was made with Government support under Contract No. DE-FC36-07GO170 awarded by the Department of Energy. The government has certain rights in this invention.

FIELD OF THE DISCLOSURE

The present disclosure is generally related to an electrical interconnect.

BACKGROUND

A photovoltaic system may use an electrical interconnect to couple a photovoltaic cell to a metalized substrate or another electrical terminal. Power generated by the photovoltaic cell may be transferred via the electrical interconnect to the metalized substrate. In concentrated photovoltaic (CPV) cell applications, optics may be used to concentrate sunlight onto the photovoltaic cell. Such systems may experience dramatic temperature differences (including changes over time and changes from one location to another location of a system) during their normal operation. These temperature differences and differences in thermal expansion coefficients of materials used in the photovoltaic system may apply significant stress to the electrical interconnect, the photovoltaic cells, and the metalized substrate.

Certain photovoltaic systems have used electrical interconnects that are capable of flexing to couple the photovoltaic cells and the metalized substrate in order to address the temperature differences or differences in thermal expansion coefficients of materials used in the photovoltaic system. However, these electrical interconnects typically have shapes that may be difficult or expensive to manufacture. For example, certain electrical interconnects include out-of-plane features, such as flexible elements that project up or down relative to a primary surface of the electrical interconnects. Forming these out-of-plane features may require additional processing steps, such as twisting the electrical interconnect to form the flexible feature.

Other flexible electrical interconnects may be formed with enclosed voids (e.g., holes) that may require additional processing steps to cut. To illustrate, an interconnect mesh with spaces or voids between traces of a conductive material may flex to accommodate thermal expansion; however, forming the spaces or voids between the traces may require additional processing. In another illustrative example, one or more other enclosed voids may be used between electrical connector pads of an electrical interconnect to accommodate thermal expansion. Examples of such enclosed voids include circular or oval voids formed in a conductor (e.g., conductive loops or torus shapes). Other examples include generally FIG. 8 shaped voids (e.g., double torus-shaped voids with a central portion between tori removed). Regardless of the shape of the enclosed void, forming enclosed voids in the electrical interconnects may require additional processing steps.

SUMMARY

Electrical interconnects that are adapted to provide stress relief by enabling relative motion between a photovoltaic cell and a metalized substrate or another electrical terminal are disclosed. Methods of forming and using the electrical interconnects are also disclosed.

A particular interconnect includes a first set of connector pads, a second set of connector pads, and a continuous central portion. A first plurality of legs extends at a first angle from the continuous central portion. Each leg of the first plurality of legs is connected to a connector pad of a first set of connector pads. A gap is defined between at least one leg and at least one other leg of the first plurality of legs. A second plurality of legs extends at a second angle from the continuous central portion. Each leg of the second plurality of legs is connected to a connector pad of the second set of connector pads. A gap is defined between least one leg and at least one other leg of the second plurality of legs. The gaps enable movement of the first set of connector pads relative to the second set of connector pads.

A particular photovoltaic system includes a photovoltaic cell to convert received light energy into electric current. The photovoltaic system also includes a terminal to receive the electric current and an interconnect coupled to the photovoltaic cell and to the terminal. The electrical interconnect provides one or more conductive paths between the photovoltaic cell and the terminal. The electrical interconnect includes a continuous central portion. A first plurality of legs extends on a first side of the continuous central portion toward a first end of the electrical interconnect, and a second plurality of legs extends on a second side of the continuous central portion toward the first end of the electrical interconnect. Gaps are defined between at least one leg and another leg of the first plurality of legs and at least one leg and another leg of the second plurality of legs.

A particular method includes forming a plurality of repeating, V-shaped structures in a metal member. The V-shaped structures include first and second sets of connector pads, a continuous central portion having a major axis, and first and second pluralities of legs. Each leg extends at an angle from the continuous central portion and each leg is connected to a connector pad. A gap is defined between at least one leg and another leg. The gap enables movement of the connector pads in a direction transverse to the major axis. The method also includes separating a predetermined number of the V-shaped structures from the metal member to form an interconnect.

A particular method includes converting a photon to an electric current using a photovoltaic cell. The method also includes conducting the electric current from the photovoltaic cell to a terminal through an electrical interconnect. The electrical interconnect includes a continuous central portion and a first plurality of legs extending on a first side of the continuous central portion toward a first end of the electrical interconnect. Gaps are defined between each leg of the first plurality of legs and at least one other leg of the first plurality of legs. The electrical interconnect also includes a second plurality of legs extending on a second side of the continuous central portion toward the first end of the electrical interconnect. Gaps are defined between each leg of the second plurality of legs and at least one other leg of the second plurality of legs.

The features, functions, and advantages that have been described can be achieved independently in various embodiments or may be combined in yet other embodiments, further details of which are disclosed with reference to the following description and drawings.

DETAILED DESCRIPTION

Electrical interconnects that are adapted to provide stress relief by enabling relative motion between a photovoltaic cell and a metalized substrate or another electrical terminal are provided. In a particular embodiment, the electrical interconnects are planar and enable in-plane and out-of-plane flexing. The flexing may reduce stress on the electrical interconnect, on the photovoltaic cell, on the metalized substrate, or any combination thereof.

In some photovoltaic systems, features that project above a surface of a photovoltaic cell may reflect light toward or away from the photovoltaic cell, changing overall efficiency of the photovoltaic system. The electrical interconnects disclosed herein may be formed without features that project above the photovoltaic cell. Thus, the electrical interconnects may be designed to avoid efficiency changing reflections.

Further, the electrical interconnect disclosed herein may have a high current carrying capacity, low manufacturing costs, small footprint, and the ability to repeatedly cycle through temperature variations without failure. In a particular embodiment, an electrical interconnect is formed from a flat sheet or strip of metal or another electrically conductive material. The flat sheet or strip may be cut, stamped or otherwise shaped to generate an electrical interconnect. The electrical interconnect may be welded, soldered or otherwise coupled to a photovoltaic cell and to a substrate or electrical terminal to electrically connect the photovoltaic cell to the substrate or to the electrical terminal. The electrical interconnect may enable in-plane and out-of-plane flexing to accommodate thermal expansion differences between the photovoltaic cell and the substrate or the electrical terminal.

Figure 1:
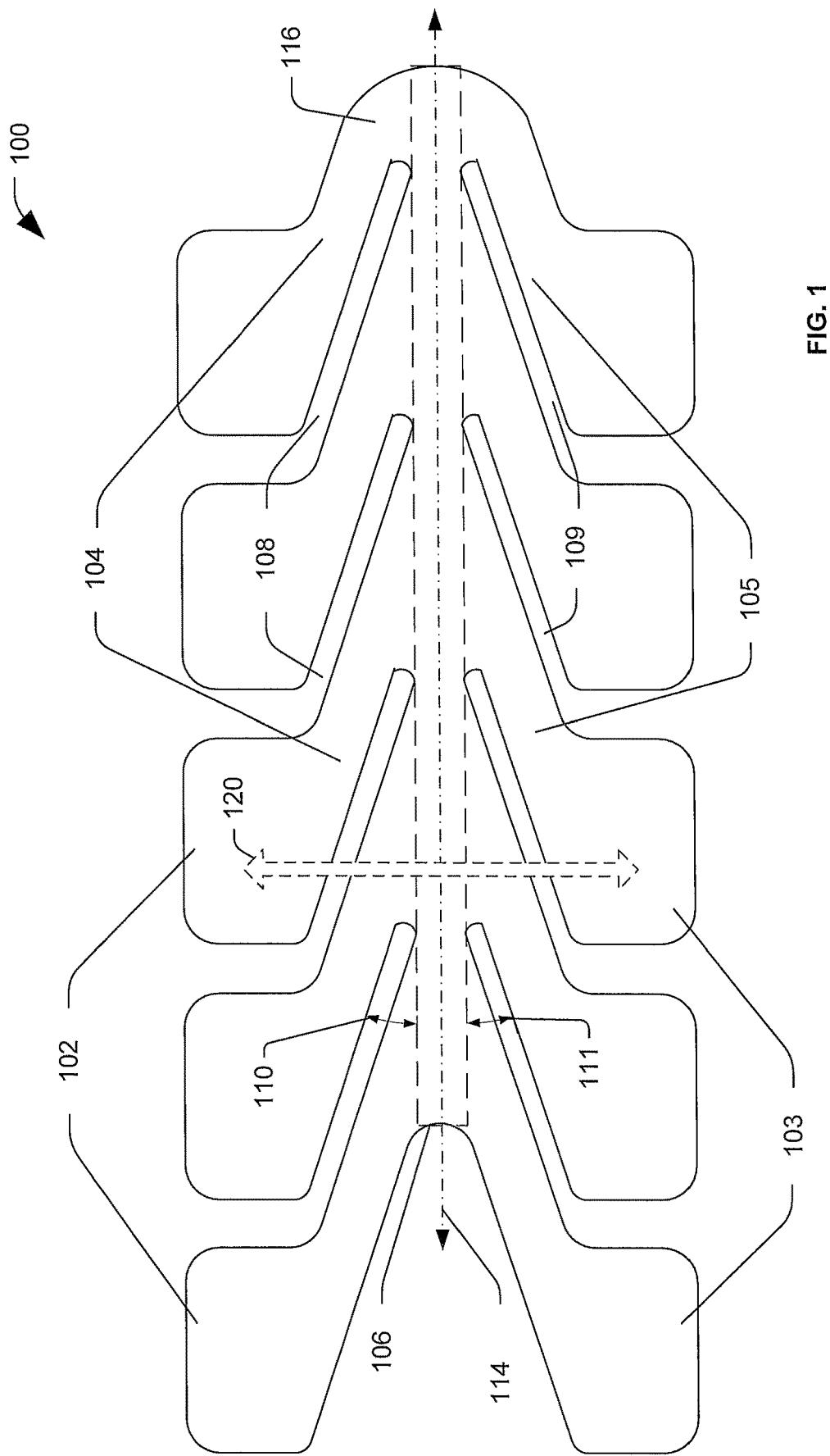
FIG. 1 is a diagram illustrating an electrical interconnect.

FIG. 1 illustrates a particular embodiment of an electrical interconnect 100. The electrical interconnect 100 may be used in a photovoltaic system, such as the photovoltaic system 200 of FIGS. 2A and 2B. To simplify FIG. 1, certain repeating features are not specifically linked to a reference numeral. For example, although the particular embodiment illustrated in FIG. 1 includes five connector pads 102 in a first set of connector pads, only two connector pads of the first set of connector pads are specifically identified by the reference numeral 102. This designation convention is also used for other repeating features of the electrical interconnect 100 in order to simplify FIG. 1.

In a particular embodiment, the electrical interconnect 100 is planar, at least as manufactured; although non-planar features may be present during use as a result of bends to accommodate installation positions or distortions due to flexure. As used herein, unless otherwise indicated in a specific context, the term "planar" indicates that a material or component (such as the electrical interconnect 100) has a relatively large width and length and a relatively small and relatively uniform thickness. In a particular embodiment, the electrical interconnect 100, as disclosed, does not include intentionally formed out-of-plane strain relief features. To illustrate, the electrical interconnect 100 may be formed of a substantially conductive sheet of material (e.g., a metal) having a relatively uniform thickness. In a particular embodiment, the electrical interconnect 100 may not include shaped (i.e., intentionally formed) structures that project above a top surface of the electrical interconnect 100. To illustrate, ignoring surface irregularities of the material used to form the electrical interconnect 100, the top surface of the electrical interconnect 100 may be substantially flat or may be substantially flat with some relatively minor projections resulting from a manufacturing process used to form the electrical interconnect 100.

The electrical interconnect 100 may be formed of a metal sheet (or another conductive sheet or strip of material) that is shaped to provide a plurality of conductive paths between the first set of connector pads 102 and a second set of connector pads 103. The metal sheet may be shaped to have a continuous central portion 106, designated in FIG. 1 by a dotted box. The metal sheet may also be shaped to include a first plurality of legs 104 and a second plurality of legs 105. Each leg of the first plurality of legs 104 may extend at a first angle 110 from the continuous central portion 106 and terminate in a connector pad 102. Alternatively, each of the first legs 104 may be coupled to a connector pad 102 of the first set of connector pads 102. A gap 108 may be defined between at least one leg 104 and one other leg 104 of the first plurality of legs 104. In an alternate embodiment, a gap 108 may be defined between each leg 104 of the first plurality of legs 104.

Each leg of the second plurality of legs 105 may extend at a second angle 111 from the continuous central portion 106 and terminate in a connector pad 103. Alternatively, each of the second legs 105 may be coupled to a connector pad 103 of the second set of connector pads 103. A gap 109 may be defined between at least one leg 105 and one other leg 105 of the plurality of second legs 105. In an alternate embodiment, a gap 109 may be defined between each leg 105 of the plurality of legs 105. The continuous central portion 106 may include a major axis 114. Together, the connector pads 102, 103 and the legs 104, 105 may define a plurality of V-shaped repeating structures or chevrons.

The electrical interconnect 100 may also include a rounded end cap 116. The rounded end cap 116 may reduce sagging or drooping of the electrical interconnect 100 at an end of the electrical interconnect 100. As illustrated in FIG. 1, each of the legs 104, 105 may extend in a direction away from the end cap 116. The electrical interconnect 100 may be substantially symmetric about a centerline of the electrical interconnect 100, e.g., along the major axis 114 of the continuous central portion 106. For example, the first angle 110 and the second angle 111 may be substantially equal in magnitude. In an alternate embodiment (not shown), the electrical interconnect 100 may be asymmetric about the centerline of the electrical interconnect 100, e.g., along the major axis 114 of the continuous central portion 106. For example, the first angle 110 and the second angle 111 may differ in magnitude, the legs 104, 105 may have different lengths, the connector pads 102, 103 may differ from one another, the continuous central portion 106 may not be straight, or other asymmetries or combinations thereof may be present.

In one embodiment, the electrical interconnect 100 may be cut from a continuous strip that includes additional V-shaped structures or chevrons (e.g., additional legs and connector pads, as described with reference to FIG. 4A-4C). The additional V-shaped structures may not form a part of the electrical interconnect 100. That is, the electrical interconnect 100 may be cut away from or otherwise separated from the additional legs and connector pads of the continuous strip. The electrical interconnect 100 may be inexpensive to form using such a continuous process. In another embodiment, the electrical interconnect 100 may be cut using a continuous cutting process, such as laser cutting. Since the electrical interconnect 100 does not include any enclosed features, a laser cutting process can be used to form the electrical interconnect 100 without turning off the laser (i.e., one continuous cut can be used).

In another embodiment, the electrical interconnect 100 may flex to accommodate movement of the first set of connector pads 102 relative to the second set of connector pads 103. For example, the gaps 108, 109 may enable in-plane movement of the first set of connector pads 102 away from the second set of connector pads 103 in a direction 120 that is transverse to the major axis 114. To illustrate, the electrical interconnect 100 may accommodate at least one percent, at least two percent, or at least three percent increase in distance between a connector pad 102 of the first set of connector pads and a corresponding connector pad 103 of the second set of connector pads in the direction 120 transverse to the major axis 114. The electrical interconnect 100 may also flex to accommodate motion in other directions. For example, the first set of connector pads 102 and second set of connector pads 103 may be able to move in opposite directions from one another. In another example, the electrical interconnect 100 may flex, twist or bend in out-of-plane directions to accommodate positioning during installation of the electrical interconnect 100 in a photovoltaic system or to accommodate thermal expansion differences after the electrical interconnect 100 has been installed. Further, each leg 104 of the first plurality of legs and each leg 105 of the second plurality of legs may flex independently of each other leg 104, 105.

Figure 2A:
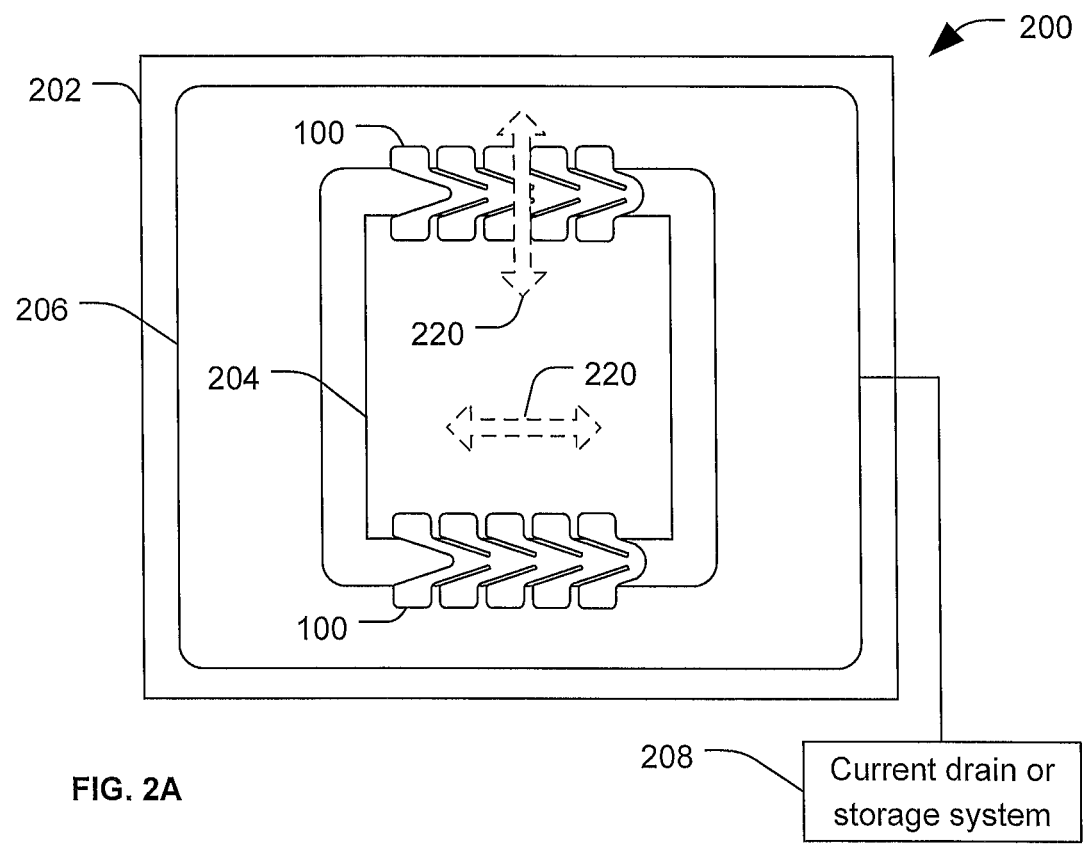
FIG. 2A is a diagram illustrating a top view of a portion of a photovoltaic system.
Figure 2B:
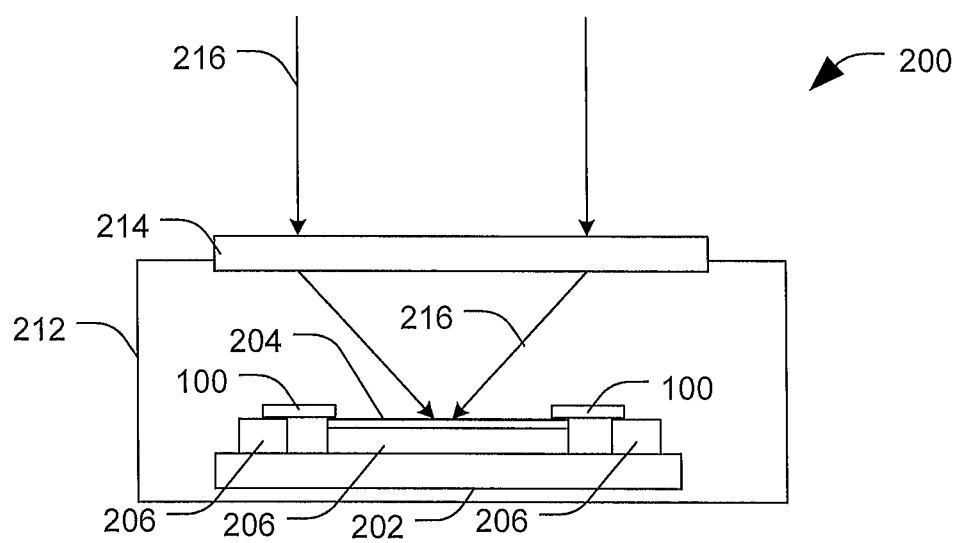
FIG. 2B is a diagram illustrating a side sectional view of a portion of a photovoltaic system.

FIGS. 2A and 2B illustrate a portion of a photovoltaic system 200. In particular, FIG. 2A is a top view and FIG. 2B is a side view of a single photovoltaic cell 204 of the photovoltaic system 200. Related portions of the photovoltaic system 200 are also shown in FIGS. 2A and 2B. In certain embodiments, the photovoltaic system 200 may include more than one photovoltaic cell and may also include other components, which are not shown in FIGS. 2A and 2B. Further, while specific embodiment of the photovoltaic system 200 illustrated in FIGS. 2A and 2B includes two electrical interconnects 100, in other embodiments, the photovoltaic system 200 may include more than or fewer than two electrical interconnects 100.

The photovoltaic system 200 includes the photovoltaic cell 204 (also referred to commonly as a solar cell) coupled to a metalized portion 206 of a substrate 202 via the electrical interconnects 100. A filler material 212 (shown in FIG. 2B) may at least partially encase the electrical interconnects 100, the photovoltaic cell 204, the substrate 202, the metalized portion 206 of the substrate 202, or any combination thereof. The metalized portion 206 of the substrate 202 may act as a terminal to receive electric current from the photovoltaic cell 204. For example, the metalized portion 206 of the substrate 202 may be electrically coupled to a current drain or to an energy storage system 208 and may direct or route the electric current from the photovoltaic cell 204 to the current drain or storage system 208.

The electrical interconnects 100 may be flexible to accommodate relative motion 220 between components of the photovoltaic system 200. For example, several different materials may be used to form the substrate 202, the metalized portion 206 of the substrate 202, the electrical interconnects 100, and the photovoltaic cell 204. The different materials may have different coefficients of thermal expansion. Additionally or in the alternative, each of the substrate 202, the metalized portion 206 of the substrate 202, the electrical interconnects 100 and the photovoltaic cell 204 may be exposed to different temperatures during use. Accordingly, the photovoltaic system 200 may experience thermal expansion differences among the different materials. For example, the photovoltaic cell 204 may include a first material having a first coefficient of thermal expansion and the metalized portion 206 of the substrate 202 may include a second material having a second coefficient thermal expansion that is different from the first coefficient of thermal expansion. Accordingly, when light 216 (shown in FIG. 2B) is shined on the photovoltaic cell 204, heat caused by the light 216 shining on the photovoltaic cell 204 may cause thermal expansion differences between components of the photovoltaic system 200. The electrical interconnects 100 may flex to accommodate the relative thermal expansion differences. The electrical interconnects 100 may flex to accommodate positioning the electrical interconnects 100 for installation in the photovoltaic system 200.

The electrical interconnects 100, as previously described in reference to FIG. 1, may include gaps 108, 109 between each of the respective legs 104, 105. The gaps 108, 109 may enable flexing of the electrical interconnects 100 to accommodate thermal expansion differences or other relative motion between the photovoltaic cell 204, the substrate 202, the metalized portion 206 of the substrate 202, or a combination thereof.

In addition, the electrical interconnects 100 may each include rounded end caps that may reduce sagging or drooping of the electrical interconnects 100 onto the substrate 202 or the metalized portion 206 of the substrate 202. Referring to FIG. 2B, the photovoltaic system 200 may also include optics 214 that focus the light 216 onto the photovoltaic cell 204. Accordingly, heat generated by the light 216 may be particularly intense at a light-exposed surface of the photovoltaic cell 204, which may cause significant thermal expansion differences within the photovoltaic system 200.

Figure 3:
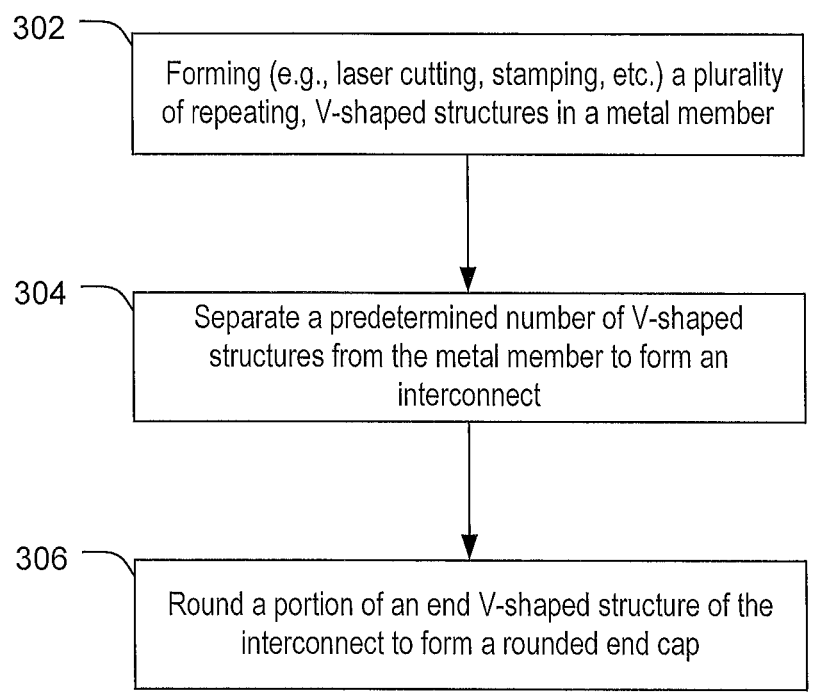
FIG. 3 is a flow chart of a method of forming an electrical interconnect.

FIG. 3 is a flow chart of an embodiment of a method of forming an electrical interconnect, such as the electrical interconnect 100 of FIG. 1. The method includes, at 302, forming a plurality of repeating V-shaped structures in a metal member, such as a metal strip or sheet. For example, the metal member may be cut to form a shape similar to the electrical interconnect 100 of FIG. 1 using laser cutting, stamping, etching, plasma cutting or other metal shaping, forming or cutting techniques. The V-shaped structures may include first and second sets of connector pads, a continuous central portion having a major axis, and first and second pluralities of legs. Each of the legs may extend at an angle from the continuous central portion and may be connected to a connector pad. A gap may be defined between each leg and at least one other leg. The gaps may accommodate in-plane movement of the connector pads in directions ranging from transverse to the major axis to opposing directions to the major axis.

The method may include separating a predetermined number of the V-shaped structures from the metal member to form an electrical interconnect, at 304. For example, the electrical interconnect 100 illustrated in FIG. 1 may be formed by separating five V-shaped structures corresponding to the electrical interconnect 100 from a continuous strip of V-shaped structures. However, other numbers of the V-shaped structures may be separated from the metal strip to form interconnects having other numbers of connector pads and legs. The method may also include, at 306, rounding a portion of an end of the V-shaped structure of the electrical interconnect to form a rounded end cap.

In a particular illustrative embodiment, the method of FIG. 3 may be performed as a continuous laser cutting process. For example, a single, continuous cut may be used to form the plurality of repeating V-shaped structures, to separate the predetermined number of the V-shaped structures from the metal member, and to round a portion of a particular V-shaped structure. In other embodiments, the method of FIG. 3 may be performed as separate steps or with one or more steps combined in a single processing activity. To illustrate, a first process may be used to form a metal member into a metal strip that defines the repeating V-shaped structures and a second processing step may be used to both round the end of the particular V-shaped structure and to separate the predetermined number of V-shaped structures from the metal strip.

Figure 4A:
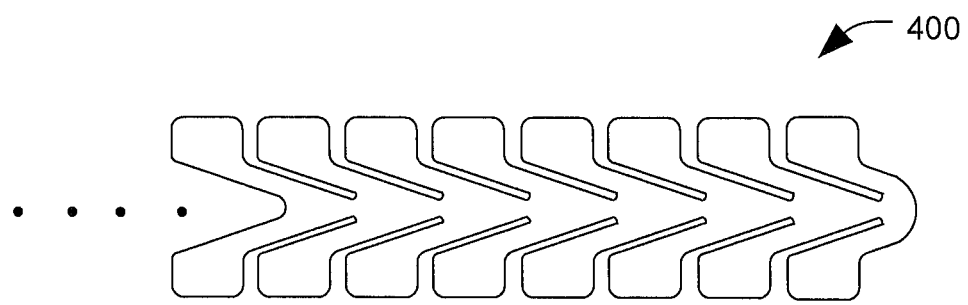
FIGS. 4A, 4B and 4C are diagrams illustrating forming an electrical interconnect.
Figure 4B:
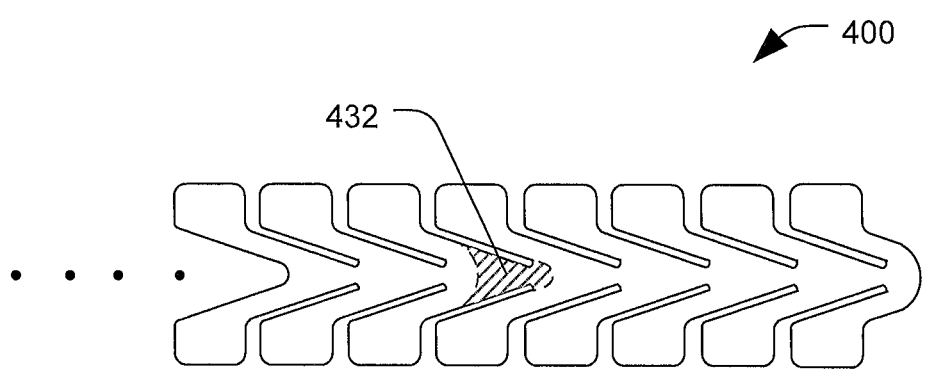
Figure 4C:
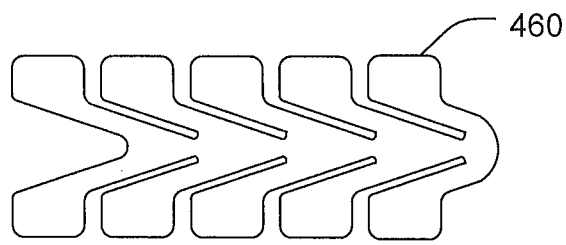

FIGS. 4A-4C illustrate an embodiment of a method of forming an electrical interconnect. FIG. 4A illustrates a continuous metal strip 400 comprising a plurality of V-shaped structures having connector pads and legs extending at an angle from a continuous central portion. As shown in FIG. 4B, a portion 432 of the metal strip may be cut away separating a predetermined number of V-shaped structures from the continuous strip 400, to form an electrical interconnect 460, shown in FIG. 4C.

Figure 5:
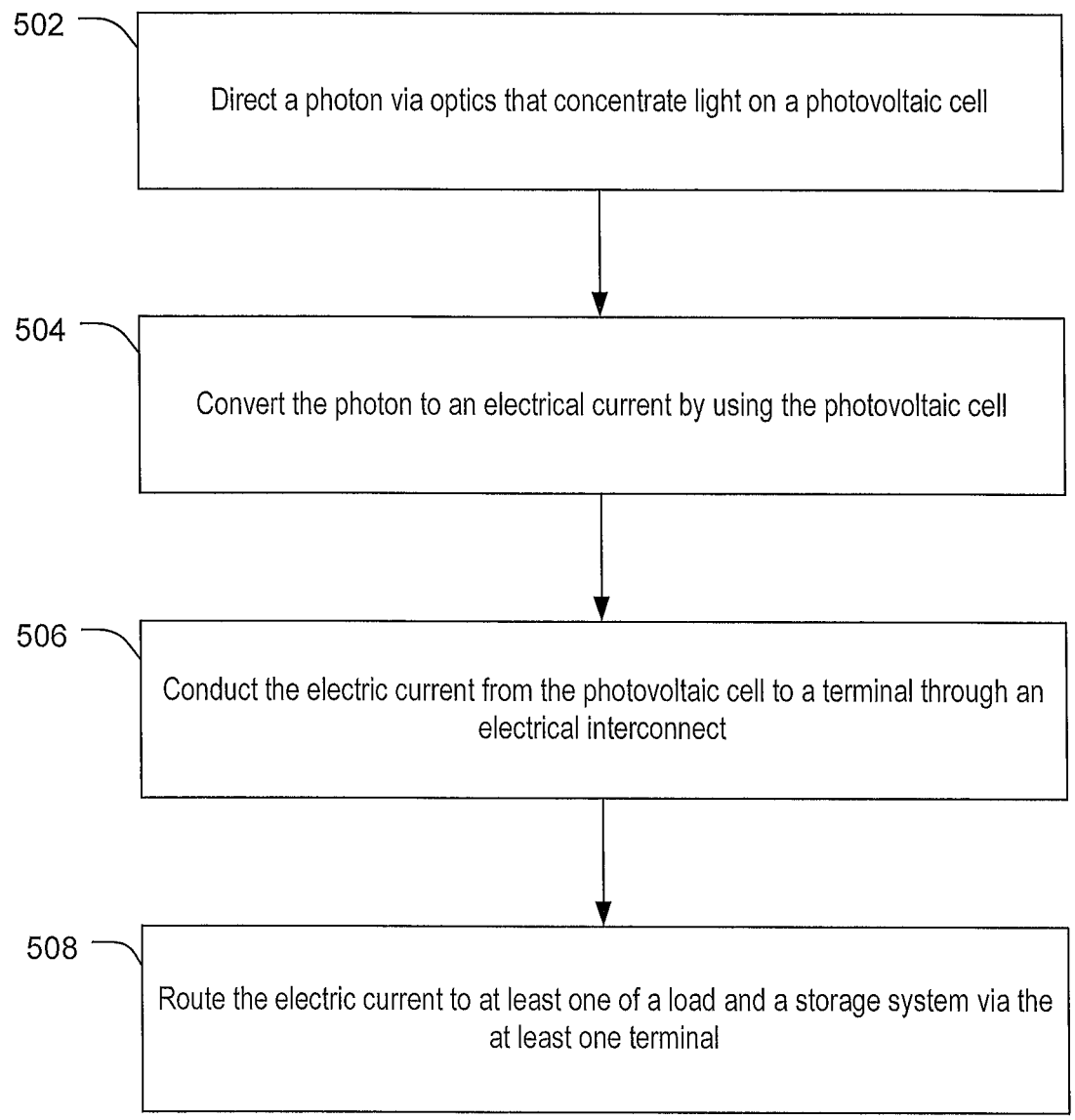
FIG. 5 is a flow chart of a method of generating an electric current.

FIG. 5 is a flow chart of a particular embodiment of a method of generating an electric current. The method includes, at 502, directing a photon via optics that concentrate light on a photovoltaic cell. For example, the photovoltaic system may receive light by directing sunlight via optics that concentrate or focus the sunlight onto a light-exposed surface of a photovoltaic cell.

The photovoltaic cell may convert the photon into an electric current, at 504. The photovoltaic system may include one or more electrical interconnects that electrically couple the photovoltaic cell to at least one terminal (such as the metalized portion 206 of the substrate 202 of FIGS. 2A and 2B). The one or more electrical interconnects may provide a plurality of conductive paths between the photovoltaic cell and the at least one terminal. For example, the one or more electrical interconnects may include the electrical interconnect 100 of FIG. 1. To illustrate, one or more of the electrical interconnects may include a continuous central portion, a first plurality of legs extending on a first side of the continuous central portion toward a first end of the electrical interconnect, and a second plurality of legs extending on a second side of the continuous central portion toward the first end of the electrical interconnect. That is, the first and second pluralities of legs may extend in the same direction (i.e., toward the first end of the electrical interconnect) on opposite sides of the continuous central portion. Gaps may be defined between each leg of the first and second pluralities of legs and at least one other leg of the first and second pluralities of legs. The electric current produced by the photovoltaic cell may be conducted from the photovoltaic cell to a terminal through the electrical interconnect, at 506.

The method may also include routing electric current to at least one of a load and storage system via the at least one terminal, at 508. The electrical interconnects may be adapted to flex, while routing the electric current to the load or storage system, to accommodate thermal expansion differences between the photovoltaic cell and the at least one terminal.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, method steps may be performed in a different order than is shown in the figures or one or more method steps may be omitted. Accordingly, the disclosure and the figures are to be regarded as illustrative rather than restrictive.

Moreover, although specific embodiments have been illustrated and described herein, it should be appreciated that any subsequent arrangement designed to achieve the same or similar results may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, the claimed subject matter may be directed to less than all of the features of any of the disclosed embodiments.

What is claimed is:

1. A method, comprising:
   forming an interconnect in a metal member, the interconnect comprising multiple repeating, nested V-shaped structures forming a continuous central portion, wherein a vertex, within a portion of the continuous central portion of each of the multiple repeating, nested V-shaped structures adjoins a next vertex of, and is nested within, a next V-shaped structure of the multiple repeating, nested V-shaped structures;
   separating the interconnect from the metal member
   coupling the interconnect to a photovoltaic cell and a terminal; and
   encasing a portion of the interconnect in filler material, wherein the interconnect is configured to route electric current from the photovoltaic cell to the terminal.

2. The method of claim 1, wherein the continuous central portion is coplanar with longitudinal axes of legs of at least one of the multiple repeating, nested V-shaped structures.

3. The method of claim 1, wherein the interconnect includes:
   a first set of connector pads;
   a second set of connector pads;

a first plurality of legs, wherein each of the first plurality of legs extends at a first angle from the continuous central portion in a single direction without bending and is connected to a different connector pad of the first set of connector pads, and wherein a first gap is defined between at least one leg and at least one other leg of the first plurality of legs; and a second plurality of legs, wherein each of the second plurality of legs extends at a second angle from the continuous central portion in the single direction without bending and is connected to a different second connector pad of the second set of connector pads, and wherein a second gap is defined between at least one leg and at least one other leg of the second plurality of legs.

4. The method of claim 3, wherein the first gap and the second gap enable a movement of the first set of connector pads relative to the second set of connector pads, wherein the movement enables at least a two percent increase in a distance between the first set of connector pads and the second set of connector pads, and wherein the movement includes a first movement of the first set of connector pads in an opposite direction to a second movement of the second set of connector pads.

5. The method of claim 1, wherein the terminal comprises a metalized portion of a substrate.

6. The method of claim 1, wherein the interconnect includes a first set of connector pads and a second set of connector pads.

7. The method of claim 6, wherein the interconnect further includes a first plurality of legs, and wherein each of the first plurality of legs extends at a first angle from the continuous central portion and is connected to a different connector pad of the first set of connector pads.

8. The method of claim 7, wherein the interconnect further includes a second plurality of legs, and wherein each of the second plurality of legs extends at a second angle from the continuous central portion and is connected to a different second connector pad of the second set of connector pads.

9. The method of claim 8, wherein each leg of the first plurality of legs and the second plurality of legs of the interconnect extends from the continuous central portion in a single direction without bending.

10. The method of claim 8, wherein a first gap is defined between at least one leg and at least one other leg of the first plurality of legs.

11. The method of claim 10, wherein a second gap is defined between at least one leg and at least one other leg of the second plurality of legs.

12. The method of claim 11, wherein the first gap and the second gap enable a movement of the first set of connector pads relative to the second set of connector pads.

13. The method of claim 12, wherein the movement enables at least a two percent increase in a distance between the first set of connector pads and the second set of connector pads.

14. The method of claim 12, wherein the movement includes a first movement of the first set of connector pads in an opposite direction to a second movement of the second set of connector pads.

15. A method, comprising:
forming, in a metal member, an interconnect, the interconnect comprising:
multiple repeating, nested V-shaped structures forming a continuous central portion, wherein a vertex, within a portion of the continuous central portion of each of the multiple repeating, nested V-shaped structures adjoins a next vertex of, and is nested within, a next V-shaped structure of the multiple repeating, nested V-shaped structures;
a first set of connector pads;
a second set of connector pads;
a first plurality of legs, wherein each of the first plurality of legs extends at a first angle from the continuous central portion in a single direction without bending and is connected to a different connector pad of the first set of connector pads, and wherein a first gap is defined between at least one leg and at least one other leg of the first plurality of legs; and
a second plurality of legs, wherein each of the second plurality of legs extends at a second angle from the continuous central portion in the single direction without bending and is connected to a different second connector pad of the second set of connector pads, and wherein a second gap is defined between at least one leg and at least one other leg of the second plurality of legs; and
separating the interconnect from the metal member.

16. The method of claim 15, wherein the interconnect is formed by etching the metal member or stamping the metal member.

17. The method of claim 15, wherein the interconnect is formed by a continuous cutting process, and wherein the interconnect is free of enclosed voids.

18. The method of claim 15, further comprising coupling the interconnect to a photovoltaic cell and a terminal.

19. The method of claim 15, further comprising encasing a portion of the interconnect in filler material.

20. The method of claim 18, wherein the interconnect is configured to route electric current from the photovoltaic cell to the terminal.

* * * * *